United States Patent
Braceras et al.

(10) Patent No.: US 6,897,674 B2
(45) Date of Patent: May 24, 2005

(54) ADAPTIVE INTEGRATED CIRCUIT BASED ON TRANSISTOR CURRENT MEASUREMENTS

(75) Inventors: George M. Braceras, Essex Junction, VT (US); Harold Pilo, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 23 days.

(21) Appl. No.: 10/604,186

(22) Filed: Jun. 30, 2003

(65) Prior Publication Data

US 2004/0263199 A1 Dec. 30, 2004

(51) Int. Cl.[7] .............................................. G01R 31/26
(52) U.S. Cl. ...................................... 324/765; 324/763
(58) Field of Search .............................. 324/765, 763, 324/769, 158.1; 714/736, 721, 718; 365/177, 230.03, 230.06

(56) References Cited

U.S. PATENT DOCUMENTS

| 4,816,757 A | * | 3/1989 | Hutchins | 324/763 |
| 6,720,785 B2 | * | 4/2004 | Bette | 324/765 |
| 6,762,608 B2 | * | 7/2004 | Damon et al. | 324/550 |

* cited by examiner

Primary Examiner—David Zarneke
Assistant Examiner—Tung X. Nguyen
(74) Attorney, Agent, or Firm—Schmeiser, Olsen & Watts; Robert A. Walsh

(57) ABSTRACT

A method of tuning an integrated circuit on an integrated circuit chip including: performing a drain current at saturation measurement of one or more test field effect transistors on the integrated circuit chip; selectively programming fuses of a bank of fuses on the integrated circuit chip based on the drain current at saturation measurement; and tuning an output of the integrated circuit based on a pattern of blown and un-blown fuses in the bank of fuses.

30 Claims, 8 Drawing Sheets

| DRIVER IMPEDANCE (TARGET = 40 OHMS) | | | | |
|---|---|---|---|---|
| | FUSE REGISTER VALUE | IMPEDANCE (ohms) | | |
| | | 25C | 55C | 85C |
| NFET COUNT (NOMINAL PROCESS) | 10000000 | 39.1 | 40.2 | 42.2 |
| NFET COUNT (WC PROCESS) | 11111111 | 38.3 | 40.7 | 41.4 |
| NFET COUNT (BC PROCESS) | 00000000 | 38.8 | 40.6 | 41.2 |

ADAPTIVE INTEGRATED CIRCUIT BASED ON TRANSISTOR CURRENT MEASUREMENTS

BACKGROUND OF THE INVENTION

1. Field of the Invention

The present invention relates to the field of integrated circuits; more specifically, it relates to an integrated circuit with performance characteristics that are tunable based on drain current at saturation ($I_{DSAT}$) measurements of representative field effect transistors (FET).

2. Background of the Invention

When integrated circuits are fabricated the physical properties of FETs on every integrated circuit chip on a wafer or even every FET on a single integrated circuit chip can vary enough from process nominal to produce varying electrical parametrics and thus cause variation from nominal in performance characteristics of integrated circuits. Such variation can lead to yield loss, especially if a particular chips parametric and performance specifications are tight.

SUMMARY OF INVENTION

A first aspect of the present invention is a method of tuning an integrated circuit on an integrated circuit chip comprising: performing a drain current at saturation measurement of one or more test field effect transistors on the integrated circuit chip; selectively programming fuses of a bank of fuses on the integrated circuit chip based on the drain current at saturation measurement; and tuning an output of the integrated circuit based on a pattern of blown and un-blown fuses in the bank of fuses.

A second aspect of the present invention is an electronic device comprising: a drain current at saturation measurement circuit; a corresponding bank of fuses; and means for tuning an output of an integrated circuit to be tuned based upon drain current at saturation measurements encoded in a pattern of blown and un-blown fuses in the fuse bank.

A third aspect of the present invention is a method of tuning an integrated circuit on an integrated circuit chip comprising: providing a drain current at saturation measurement circuit on the integrated circuit chip; providing a corresponding bank of fuses on the integrated circuit chip; and tuning an output of the integrated circuit based upon the drain current at saturation measurements made using the drain current at saturation measurement circuit encoded in a pattern of blown and un-blown fuses in the fuse bank.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

The current through the drain of a FET saturates or reaches a maximum value versus the voltage applied to the drain $V_D$ of a FET as a function of the voltages applied to the gate and $V_G$ and the threshold voltage $V_T$ of device of the FET. It is caused by pinch-off of the channel in the vicinity of the gate. Equation (1) defines $I_{DSAT}:I_{DSAT}=(Z\mu_n C_i/2L)(V_G-V_T)2(1)$ where: Z=channel width; $\mu_n$=mobility of majority carrier; Ci=gate capacitance per unit area; L=channel length; $V_G$=voltage on the gate; and $V_D$=voltage on the drain.

Figure 1:
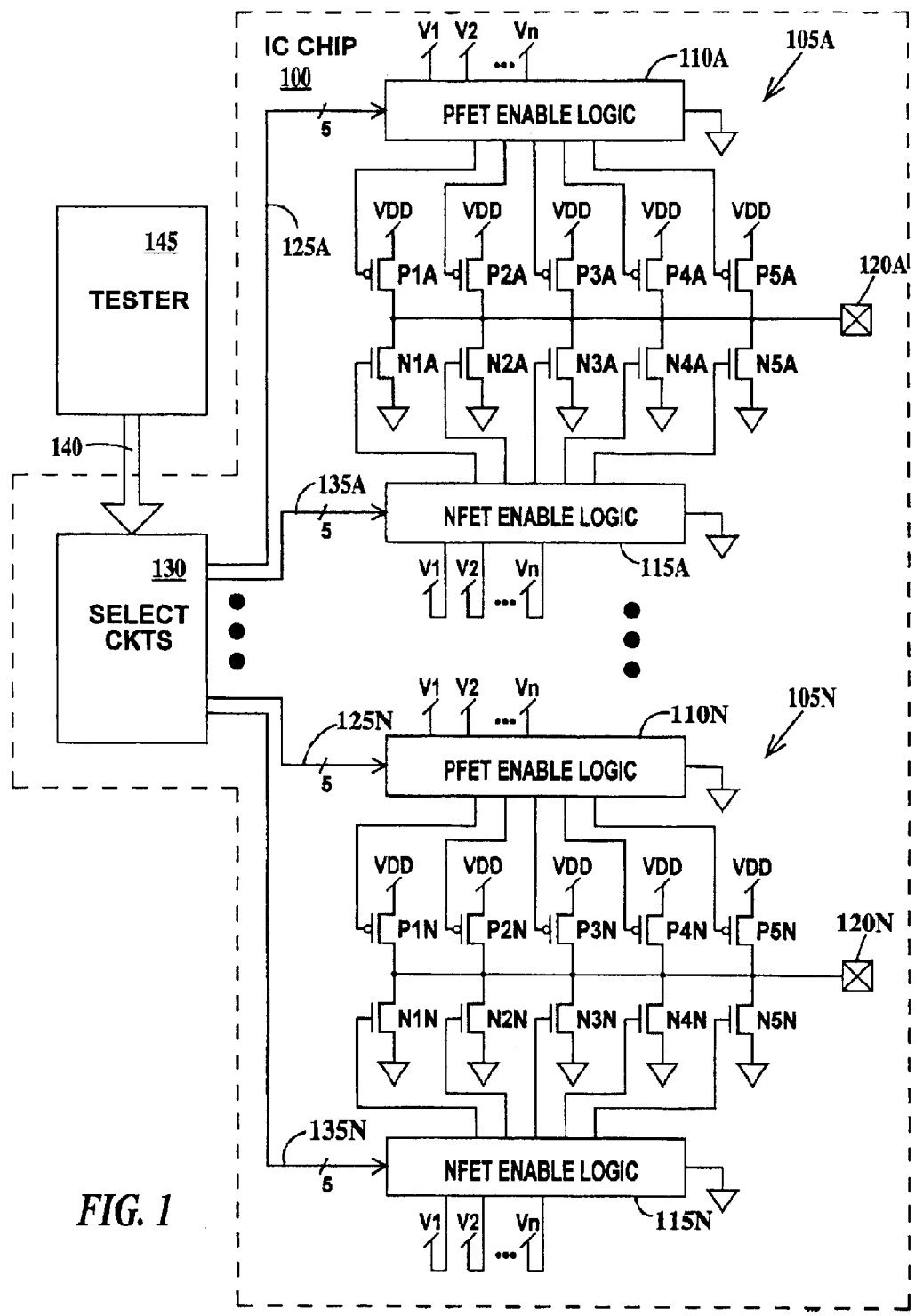
FIG. 1 is schematic diagram of a set of an $I_{DSAT}$ measurement circuit according to the present nvention.

There are three attributes of FETs that can cause changes in $I_{DSAT}$ measurements. The first is $L_{EFF}$ (the effective length of the channel), which, is generally caused by photolithography. Across chip linewidth variation (ACLV) or across wafer linewidth variation (AWCV) can cause substantial LEFF variations. The second is $V_T$ (the threshold voltage of FETs), which is generally caused by source/drain dopant variations. The third is $t_{OX}$ (the electrical thickness of the gate dielectric of FETs), which is primarily related to physical thickness, dielectric constant and structure of the gate dielectric FIG. 1 is schematic diagram of a set of an $I_{DSAT}$ measurement circuit according to the present invention. In FIG. 1, an integrated circuit chip 100 includes a multiplicity of $I_{DSAT}$ measurement circuits 105A to 105N. $I_{DSAT}$ measurement circuit 105A includes a set of P-channel field effect transistor (PFET)s P1A, P2A, P3A, P4A and P5A and a set of N-channel field effect transistor (NFET)s N1A, N2A, N3A, N4A and N5A, a PFET enable logic 110A and an NFET enable logic 115A. The drains of PFETs P1A, P2A, P3A, P4A and P5A and NFETs N1A, N2A, N3A, N4A and N5A are coupled to an input/output (I/O) pad 120A. The sources of PFETs P1A, P2A, P3A, P4A and P5A are coupled to VDD and the sources of NFETS N1A, N2A, N3A, N4A and N5A are coupled to ground. The gates of PFETs P1A, P2A, P3A, P4A and P5A are coupled to PFET enable logic 110A and the gates of NFETS N1A, N2A, N3A, N4A and N5A are coupled to NFET enable logic 115A. PFET enable logic 110A is responsive to a select signal on bus 125A generated by a select circuit 130. NFET enable logic 115A is responsive to a select signal on bus 135A generated by select circuit 130. Select circuit 130 is responsive to control signals sent on bus 140 and generated by an off-chip tester 145.

In the present example, there are five test PFET devices and five test NFET devices in each $I_{DSAT}$ measurement circuit 105A to 105N. There may be less than five or more than five PFETs and PFETS, the number being a function of the different types of NFETs and PFETs used by critical circuits on integrated circuit chip that are to be tuned. For example, PFETs P1A to P1N and NFETs N1A to N1N may be nominal devices (nominal devices are PFETs and NFETs having nominal technology groundrules for threshold voltage, gate length and gate dielectric thickness), PFETs P2A to P2N and NFETs N2A to N2N may be long or short channel length devices, PFETs P3A to P3N and NFETs N3A to N3N may be high threshold or low threshold voltage devices, PFETs P4A to P4N and NFETs N4A to N4N may be thick or thin gate oxide devices and PFETs P5A to P5N and NFETs N5A to N5N may be devices of a combination of nominal, high or low threshold voltage, nominal short or long channel devices and nominal, thin or thick oxide gate devices. The devices are selected to match the devices in the circuit to be tuned.

Note, not all $I_{DSAT}$ measurement circuits 105A to 105N need have the same number of devices, the same mix of device types, or even the same number of test PFETs and test NFETS since the PFET enable logic 110A to 110N and the NFET enable logic 115A to 115N can be custom designed based on the type and mix of test NFETs and test PFETs in each $I_{DSAT}$ measurement circuit.

In the example of FIG. 1, $I_{DSAT}$ measurement circuit 105N is similar to $I_{DSAT}$ measurement circuit 105A, PFETS P1N, P2N, P3N, P4N and P5N corresponding to PFETS P1A, P2A, P3A, P4A and P5A and NFETS N1N, N2N, N3N, N4N and N5N corresponding to NFETS N1A, N2A, N3A, N4A and N5A. PFET enable logic 110N and NFET enable logic 115N have respective corresponding functions to PFET enable logic 110A and NFET enable logic 115A.

Since $I_{DSAT}$ measurement circuits 105A to 105N are similar, only the operation of $I_{DSAT}$ measurement circuit 105A will be described in detail. In operation, a select signal is sent to PFET enable logic 110A from select circuit 130. PFET enable logic 110A connects the gate of the "selected" test PFET (one of PFETs P1A, P2A, P3A, P4A or P5A) to of one of voltage sources V1 to Vn. The gates of the "unselected" PFETs are coupled to $V_{DD}$. An $I_{DSAT}$ measurement of the "selected" PFET can now be made. The IDSAT measurement is described infra in reference to FIG. 3. In turn, each of the previously "unselected" test PFETs is "selected" and $I_{DSAT}$ of the "selected" test PFET measured.

Similarly for the test NFETs, a select signal is sent to NFET enable logic 115A from select circuit 130. NFET enable logic 115A connects the gate of the "selected"test NFET (one of NFETs N1A, N2A, N3A, N4A or N5A) to of one of voltage sources V1 to Vn. The gates of the "unselected" NFETs are coupled to ground. An $I_{DSAT}$ measurement of the "selected" NFET can now be made. In turn, each of the previously "unselected" test NFETs is "selected: and $I_{DSAT}$ of the "selected" test NFET measured. In an $I_{DSAT}$ measurement of a PFET the I/O pad is forced to GND and the current flow between VDD and the I/O pad is measured. In an $I_{DSAT}$ measurement of an NFET the I/O pad is forced to VDD and the current flow between GND and the I/O pad is measured.

Several voltage sources V1 to Vn are provided because different test PFETs and test NFETs may require different gate voltages and/or to enable testing of the same test PFET or test NFET at several different voltages. These options are either "hardwired" into PFET enable logic 110A and NFET enable logic 115A or PFET enable logic 110A and NFET enable logic 115A themselves may be programmable, responsive to additional control signals (not shown in FIG. 1) from select circuit 130. Select circuit 130 optionally may be responsive to Joint Test Action Group (JTAG) modes (part of IEEE standard 1149.1) sent by tester 145 via control signal bus 140.

Depending upon the channel capacity of tester 145, all $I_{DSAT}$ measurement circuits 105A to 105N may be measured simultaneously or sequentially. It is possible to have multiple I/O pads 120A, each coupled to subsets of test NFETs and PFETs. Also, I/O pads 120A to 120N may be shared (switchable) with other integrated chip I/O functions, though the impedance of a switching network could distort the $I_{DSAT}$ measurement.

Figure 2A:
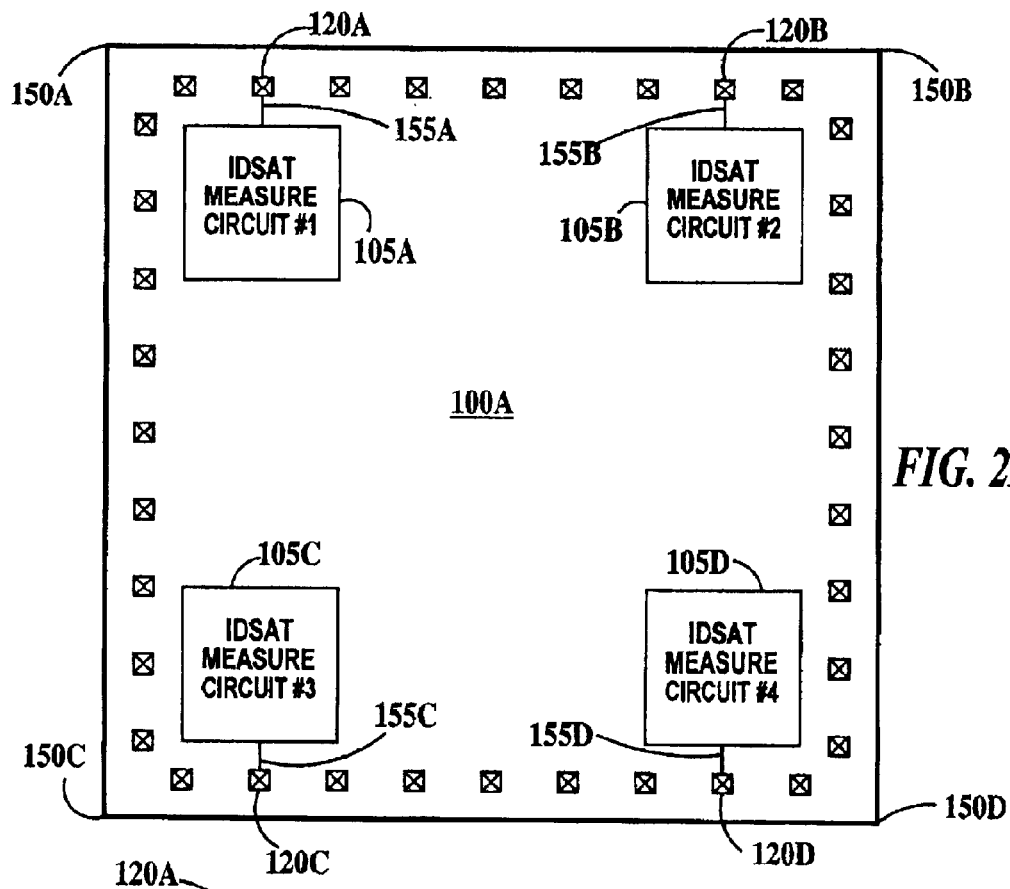
FIG. 2A is plan view of an integrated circuit chip, illustrating placement of $I_{DSAT}$ measurement circuits according to a first embodiment of the present invention.
Figure 2B:
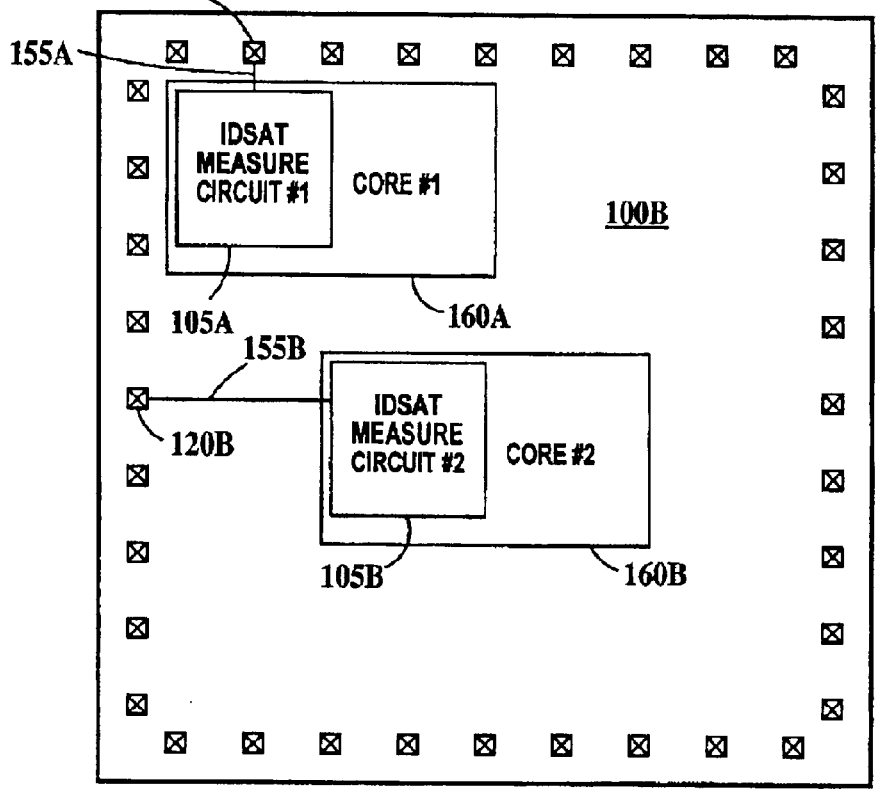
FIG. 2B is plan view of an integrated circuit chip, illustrating placement of $I_{DSAT}$ measurement circuits according to a second embodiment of the present invention.
Figure 3:
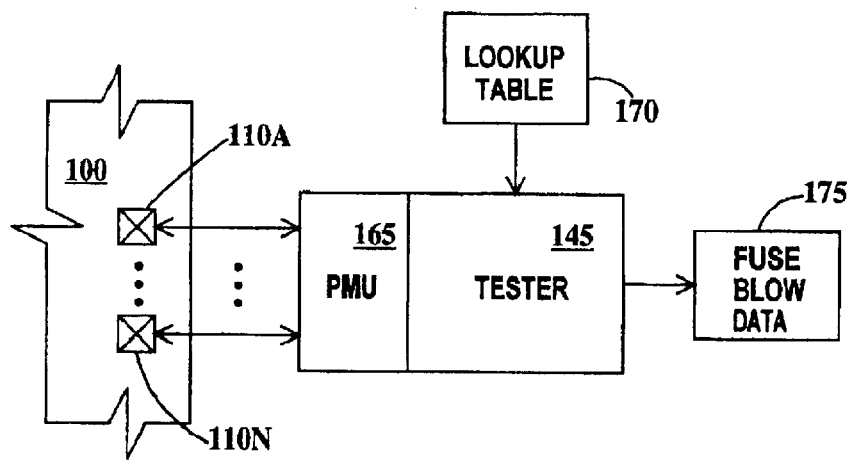
FIG. 3 is a block diagram illustrating generation of fuse blow data based on $I_{DSAT}$ measurements according to the present invention.

FIG. 2A is plan view of an integrated circuit chip, illustrating placement of $_{DSAT}$ measurement circuits according to a first embodiment of the present invention. In FIG. 2A, four $I_{DSAT}$ measurement circuits 105A, 105B, 105C and 105D are placed in proximity to four corners 150A, 150B, 150C and 150D respectively of integrated circuit chip 100A. This placement is especially useful for picking up changes in PFET and NFET parametrics caused by ACLV. $I_{DSAT}$ measurement circuits 105A, 105B, 105C and 105D are also placed close to I/O pads 120A, 120B, 120C and 120D respectively, in order to minimize impedance in wires 155A, 155B, 155C and 155D between the $I_{DSAT}$ measurement circuits and the I/O pads effecting the IDSAT measurements themselves. A peripheral pad layout is illustrated in FIG. 2A for clarity, however the present invention is applicable to any arrangement of pads FIG. 2B is plan view of an integrated circuit chip, illustrating placement of $I_{DSAT}$ measurement circuits according to a second embodiment of the present invention. In FIG. 2B, two $I_{DSAT}$ measurement circuits 105A and 105B are placed in within (or in proximity) to two cores 160A and 160B respectively of integrated circuit chip 100B. This placement is especially useful tuning FET parametrics specific to a given core. A core is a pre-designed circuit function selected from a library of designs and integrated into a chip design. One examples of a core is an embedded memory. $I_{DSAT}$ measurement circuits 105A and 105B are also placed close to I/O pads 120A and 120B respectively, in order to minimize impedance in wires 155A and 155B between the $I_{DSAT}$ measurement circuits and the I/O pads effecting the $I_{DSAT}$ measurements themselves. A peripheral pad layout is illustrated in FIG. 2B for clarity, however the present invention is applicable to any arrangement of pads FIG. 3 is a block diagram illustrating generation of fuse blow data based on $I_{DSAT}$ measurements according to the present invention. In FIG. 3, I/O pads 110A to 110N of integrated circuit chip 100 are electrically connected to a parametric measurement unit (PMU) 165 of tester 145, which performs the $I_{DSAT}$ measurements as described supra. Based on the value of the $I_{DSAT}$ measurement obtained, tester 145 finds the closest value of the $I_{DSAT}$ measurement on a lookup table 170 (see FIG. 3) and generates fuse blow data 175. The fuse blow data is a multi-bit word indicating which fuses to blow (programming a fuses is defined as blowing the fuse) on integrated circuit chip 100 in order to encode the $I_{DSAT}$ measurements on the integrated circuit chip. The fuse circuits are illustrated in FIG. 5 and described infra.

Figure 4:
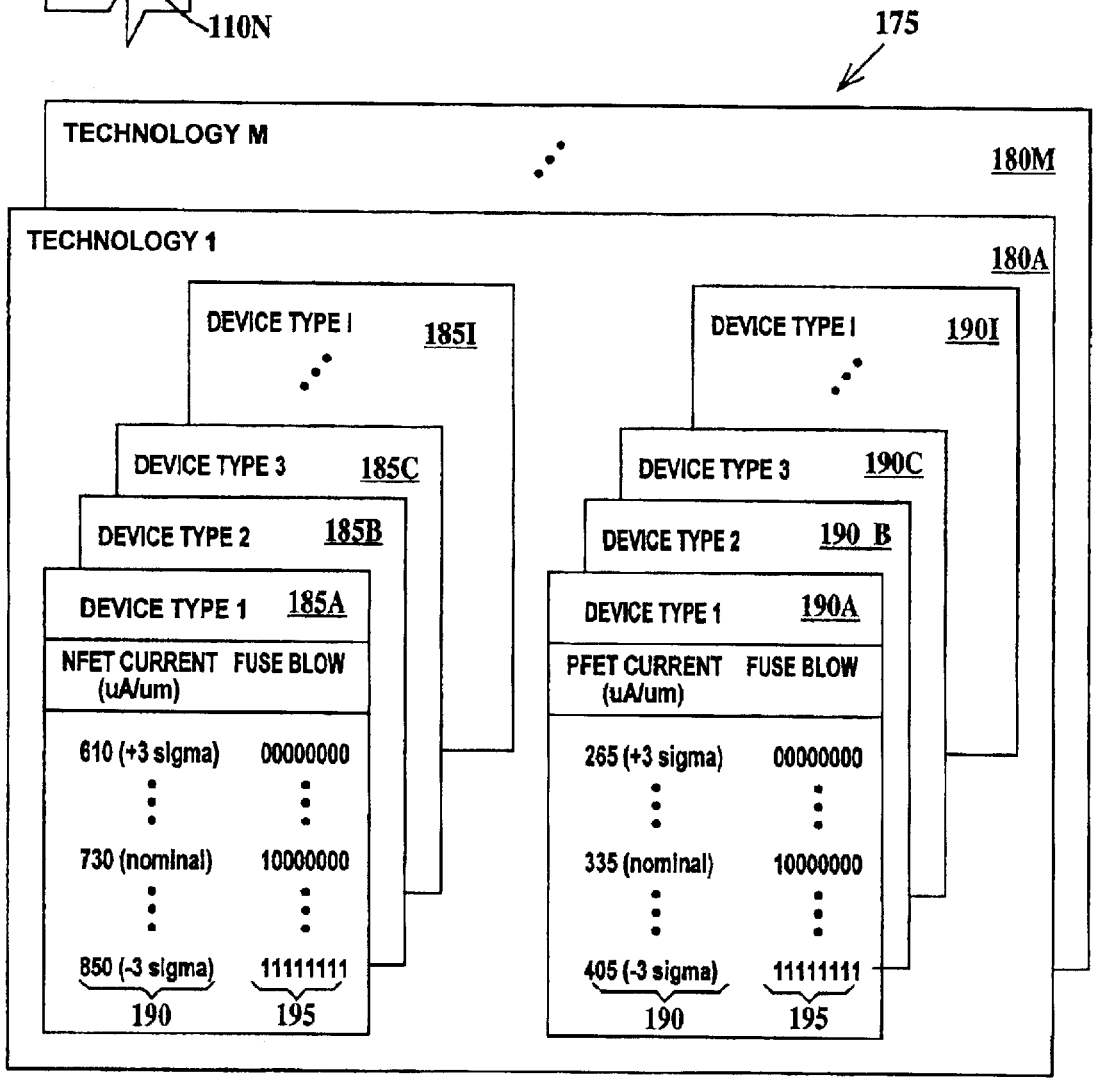
FIG. 4 is an exemplary fuse blow pattern lookup table according to the present invention.

FIG. 4 is an exemplary fuse blow pattern lookup table according to the present invention. Lookup table 170 includes a multiplicity of technology type pages 180A to 180M, there being one page for each technology type. A technology type is defined by physical groundrules and operating voltages. Each technology type page 180A to 180M includes a multiplicity of NFET tables 185A to 185I and PFET tables 190A to 190I, there being one table for each PFET and NFET type to be $I_{DSAT}$ measured. Each NFET table 185A to 185I and PFET table 190A to 190I includes a list of $I_{DSAT}$ measurement values 190 and corresponding fuse blow patterns 195. In the example of FIG. 4, the fuse blow patterns are 8-bits (for eight fuses) and a zero indicates do not blow the fuse corresponding to that bit position and a one indicates do blow the fuse corresponding to that bit position. The number of lines of $I_{DSAT}$ and corresponding fuse blow pattern on each page is a function of the granularity of $I_{DSAT}$ measurement and the number of fuses per fuse bank.

Figure 5:
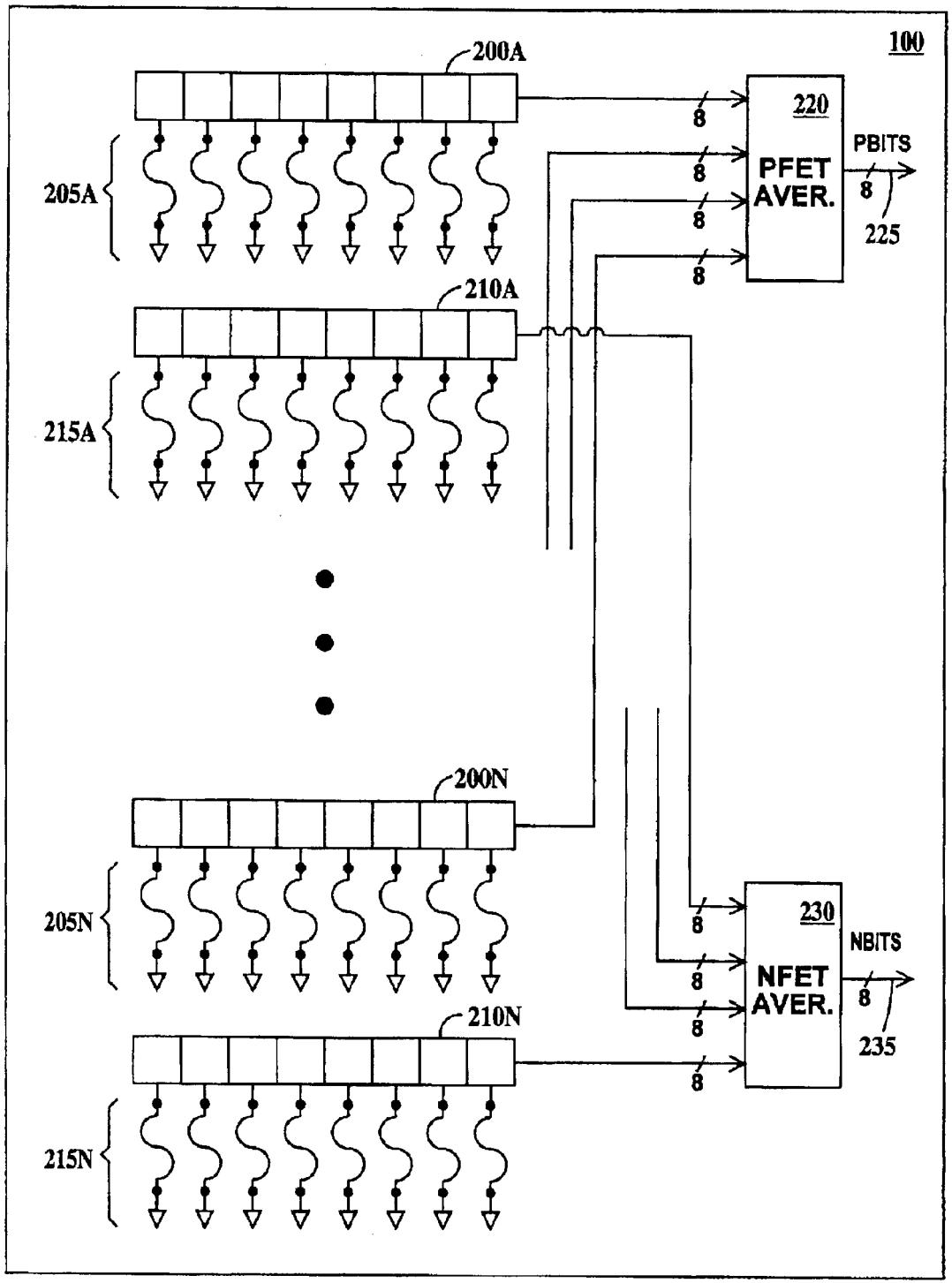
FIG. 5 is an exemplary fuse bank circuit for encoding on chip $I_{DSAT}$ measurements according to the present invention.

FIG. 5 is an exemplary fuse bank circuit for encoding on chip $I_{DSAT}$ measurements according to the present invention. In FIG. 5, integrated circuit chip 100 includes a multiplicity of PFET fuse registers 200A to 200N store the state (0 not blown, 1 blown) of corresponding PFET fuse banks 205A to 205N. There is one set of PFET fuse registers 200A to 200N and fuse banks 205A to 205N for each $I_{DSAT}$ measurement circuit 105A to 105N illustrated in FIG. 1 and described supra. Further, integrated circuit chip 100 includes a multiplicity of NFET fuse registers 210A to 210N store the state (0 not blown, 1 blown) of corresponding NFET fuse banks 215A to 215N. There is one set of PFET fuse registers 210A to 210N and fuse banks 215A to 210N for each $I_{DSAT}$ measurement circuit 105A to 105N illustrated in FIG. 1 and described supra.

Fuses in fuse banks 205A to 205N and 215A to 215N may be laser blow fuses, electrical blow fuses or electrical blow antifuses. In the example of FIG. 5, there are eight fuses per bank and the registers are eight bit registers. However, any number of fuses sufficient to encode the granularity of the $I_{DSAT}$ measurements may be used. As an example, the outputs of PFET registers 200A to 200N may be averaged together by a PFET averaging circuit 220 to produce a PBITs signal 225 and the outputs of NFET registers 205A to 205N may be averaged together by an NFET averaging circuit 230 to produce an NBITs signal 235.

Figures 6A, 6B:
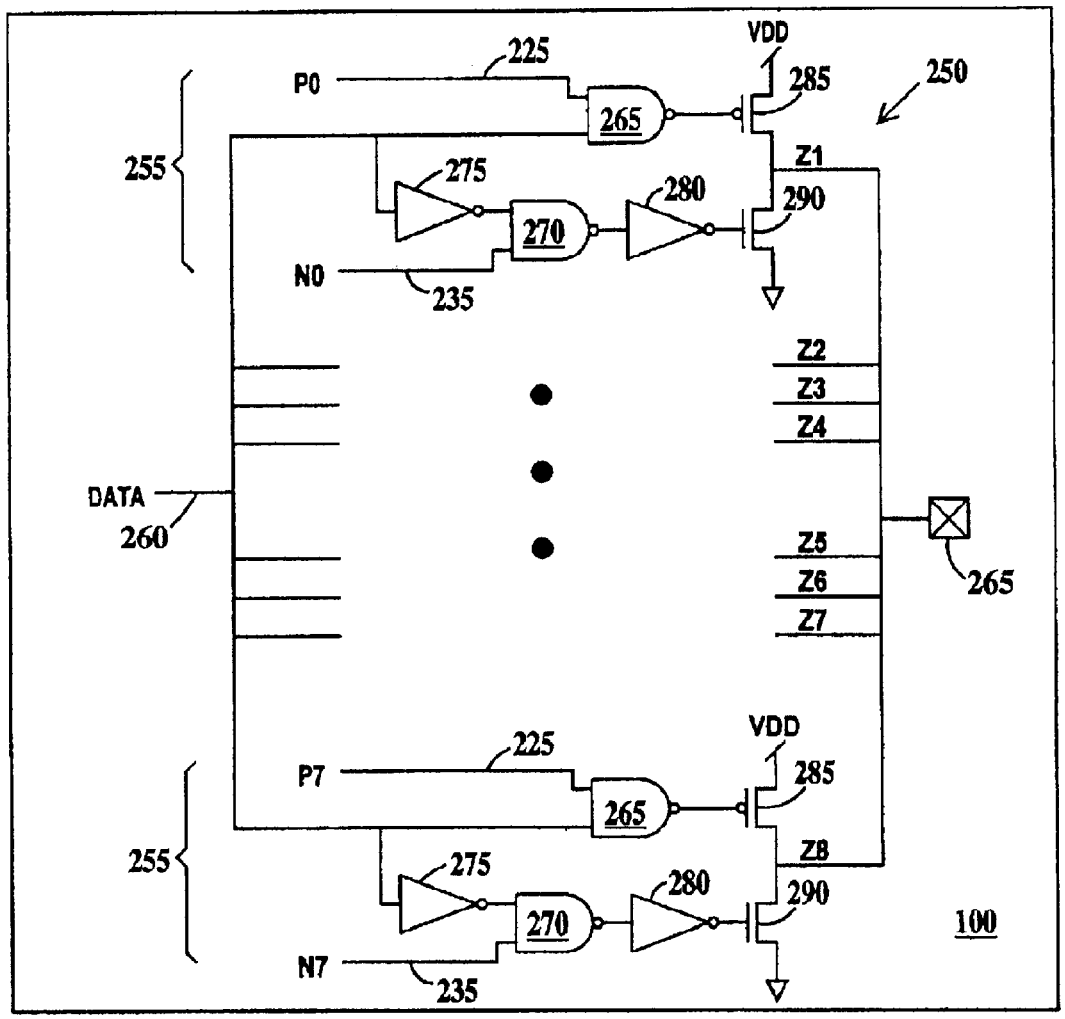
FIGS. 6A and 6B illustrate respectively, an exemplary tunable off chip driver (OCD) circuit and lookup table according to the present invention.

FIGS. 6A and 6B illustrate respectively, an exemplary tunable off chip driver (OCD) circuit and lookup table according to the present invention. In FIG. 6A, integrated circuit chip 100 includes a tunable OCD 250 includes eight driver circuits 255 receiving a data signal 260 and driving currents Z0 to Z7 to an output pad 265. There are eight driver circuits 255 because PBITs signal 225 (see FIG. 5) and NBITs signal 235 (see FIG. 5) are, in the present example, 8-bit wide signals.

Each driver circuit 255 includes first and second NAND gates 265 and 270, first and second inverters 275 and 280, a PFET 285 and an NFET 290. One bit (P0 to P7) of PBITs signal 225 is coupled to a first input of first NAND gate 265 and data signal 260 is coupled a second input of first NAND gate 265. The output of first NAND gate 265 is coupled to the gate of PFET 285. One bit (N0 to N7) of NBITs signal 235 is coupled to a first input of second NAND gate 270 and data signal 260 is coupled through first inverter 275 to a second input of second NAND gate 270. The output of second NAND gate 265 is coupled through second inverter 280 to the gate of NFET 290. The source of PFET 285 is coupled to VDD and the source of NFET 290 is coupled to GND. The drains of PFET 285 and NFET 290 are coupled to output pad 265.

Whenever a bit P0 to P7 of PBITs signal 225 and a corresponding bit N0 to N7 of NBITs signal 235 is a one, then the corresponding driver circuit 255 will supply current to output pad 265 in response to a high data signal 260.

FIG. 6B illustrates how nominal, worst case (WC) process and best case (BC) process may be encoded in fuse registers which would result in PBITs signals 225 and NBITs signals 235 producing on output pad 265 the impedances listed at the exemplary operating temperatures of 25° C., 55° C. and 85° C.

Figure 7A:
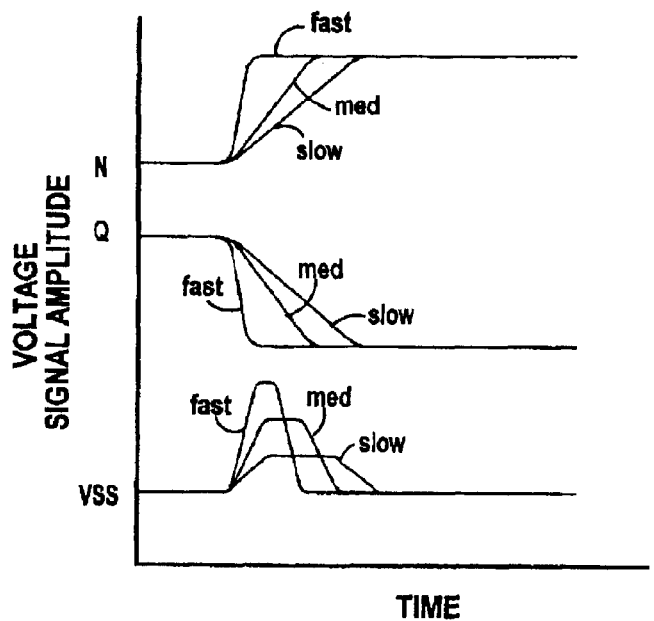
FIG. 7A is a timing diagram illustrating the relationship between noise and speed (dI/dt) of an OCD.
Figure 7B:
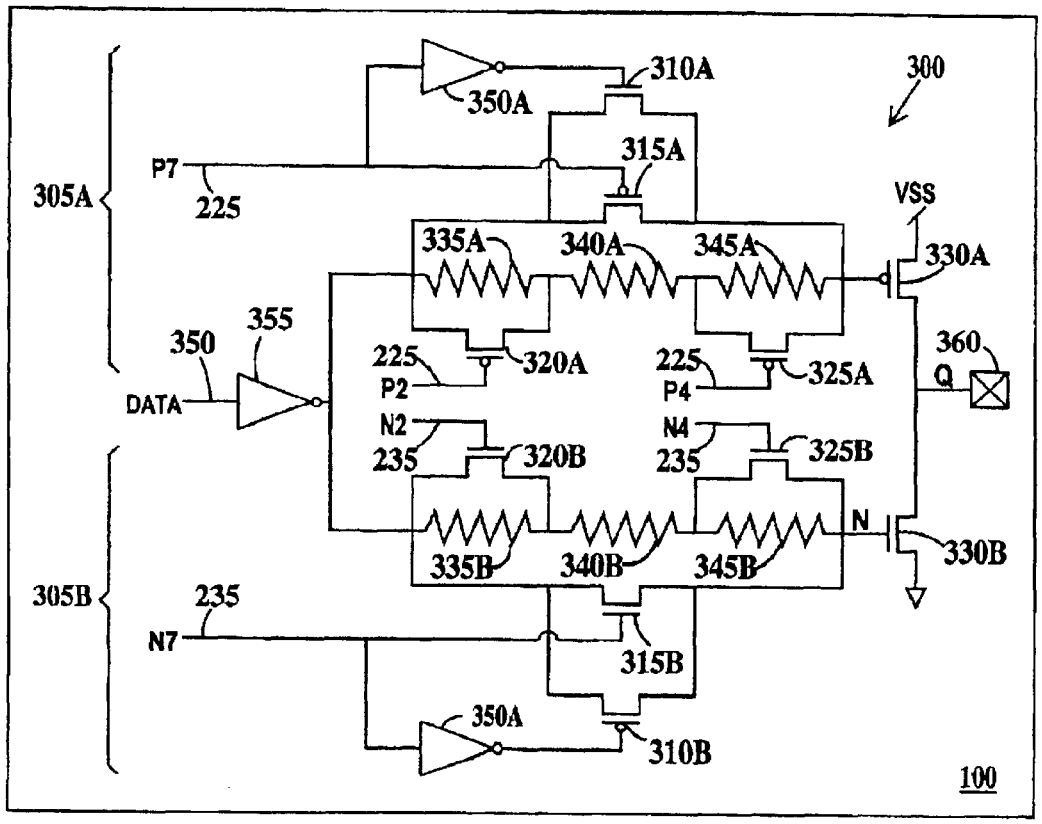
FIG. 7B is a schematic diagram of an exemplary time rate of change of current (dI/dt) tunable OCD circuit according to the present invention.

FIGS. 7A is a timing diagram illustrating the relationship between noise and speed (dI/dt) of an OCD. In FIG. 7A, a typical timing diagram for an OCD is shown. Three NFET gate voltage curves (N), three output voltage curves (Q) and three noise levels on the power supply of the PFET source ($V_{SS}$) and hence the output of the OCD are illustrated for fast, medium, and slow switching speeds. As may be seen from FIG. 7A, as the speed of an OCD increases, so does the noise on the $V_{SS}$ terminal of the OCD. FIG. 7B illustrates an OCD that may be tuned, according to the present invention) to control the switching speed of an OCD and hence the noise on the output pad of the OCD.

FIG. 7B is a schematic diagram of an exemplary dI/dt tunable OCD circuit according to the present invention. In FIG. 7B, only three bits of PBITs signal 225 (the P2, P4 and P7 bits) and the corresponding three bits of NBITs signal 235 (the N2, N4 and N7 bits) are used. In FIG. 7B, OCD 300 on integrated circuit chip 100 includes a PFET gate delay circuit 305A and an NFET gate delay circuit 305B. PFET delay circuit 305A includes an NFET 310A and first, second, third and fourth PFETs 315A, 320A, 325A and 330A and first, second, and third resistors 335A, 340A and 345A and in inverter 350A. The P7 bit of PBITs signal 225 is coupled to the gate of first PFET 315A and through inverter 350A to the gate of NFET 310A. The P2 bit of PBITs signal 225 is coupled to the gate of second PFET 320A and P4 bit of PBITs signal 225 is coupled to the gate of third PFET 325A. First, second and third resistor 335A, 340A and 345A are coupled in series with second resistor 340A between first resistor 335A and third resistor 345A. The source/drains of NFET 310A and the source drains of first PFET 315A is coupled across the series resistor comprising first, second and third resistors 335A, 340A and 345A. The source/drains of second PFET 320A are coupled across first resistor 335A and the source/drains of third PFET 325A are coupled across third resistor 345A.

NFET delay circuit 305B includes a PFET 310B and first, second, third and fourth NFETs 315B, 320B, 325B and 330B and first, second, and third resistors 335B, 340B and 345B and in inverter 350B. The N7 bit of NBITs signal 235 is coupled to the gate of first NFET 315B and through inverter 350B to the gate of PFET 310B. The N2 bit of NBITs signal 235 is coupled to the gate of second NFET 315B and N4 bit of NBITs signal 235 is coupled to the gate of third NFET 325B. Fourth, fifth and sixth resister 335B, 340B and 345B are coupled in series with fifth resistor 340B between fourth resistor 335B and sixth resistor 345B. The source/drains of PFET 310B and the source drains of first NFET 315B is coupled across the series resistor comprising fourth, fifth and sixth resistors 335B, 340B and 345B. The source/rains of second NFET 320B are coupled across fourth resistor 335B and the source/drains of fifth NFET 325B are coupled across sixth resistor 345B.

A data signal 350 is coupled through an inverter 355 to a first end of the series resistor formed by first, second and third resistors 335A, 340A and 345A and to a first end of the series resistor formed by fourth, fifth and sixth s 335B, 340B and 345B. The gate of fourth PFET 330A is coupled to a second end of the series resistor formed by first, second and third resistors 335A, 340A and 345A. The gate of fourth NFET 330B is coupled to a second end of the series resistor formed by fourth, fifth and sixth resistors 335B, 340B and 345B. The drains of fourth PFET 330A and fourth NFET 330B are coupled to an output pad 360. The source of fourth PFET 330A is coupled to $V_{SS}$ and the source of fourth NFET 330B is coupled to GND.

OCD driver 300 can be tuned to eight ($2^3$) different delays based on the combinations of bit values of PBITs P2, P4 and P7 and the bit values of NBITs N2, N4 and N7. In one example, if P2 and P4 are one, N2 and N4 are zero, and P7 is zero and N7 is one, then all resistors are bypassed and there is no delay added to the data path. In a second example, if P2 is zero, N2 is one, P4 is one, N4 is zero, P7 is one and N7 is zero then the data path includes the delays caused by the combination of second and third resistors 340A and 345A and by the delays caused by the combination of fifth and sixth resistors 340B and 345B.

Note, that the P7 and N7 bits are illustrated as inputs to complementary pass gates (NFET/PFET 310A/315A and NFET/PFET 315B/310B respectively) and the P2, N2, P4 and N4 bits are illustrated as inputs to single pass gates (PFET 320A, NFET 320B, PFET 325A and NFET 325B respectively). However, one of ordinary skill in the art would know that the PFET 320A, NFET 320B, PFET 325A and NFET 325B could be replaced with complementary pass gates and vice versa.

Figure 8A:
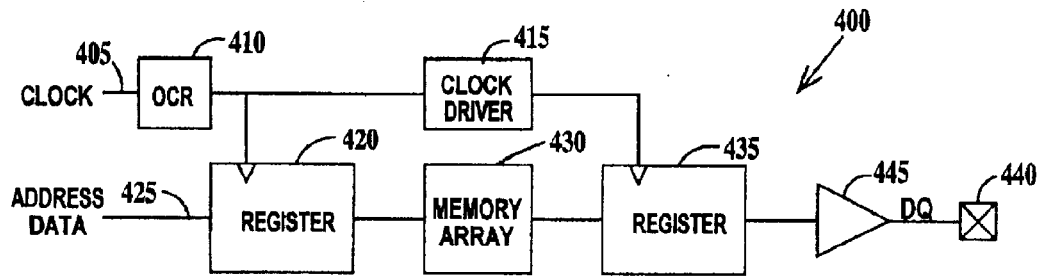
FIG. 8A is a schematic diagram of a related art data-generating circuit.

FIG. 8A is a schematic diagram of a related art data-generating circuit (DGC). In FIG. 8A DGC 400 includes an on chip receiver (OCR) 410, an input of OCR 410 coupled to a clock signal 405 and an output of OCR 410 coupled to an input of a clock driver 415 and coupled to a clock input of a first register 420. An input of first register 410 is coupled to an address signal 425 and an output of first register 420 is coupled to a memory array 430. An output of memory array 430 is coupled to an input of a second register 435 and an output of clock driver 415 is coupled to a clock input of second register 435. The output of second register 435 is coupled to an output pad 440 through an off-chip driver (OCD) 445. The signal on output pad 440 is a data out (DQ) signal which is gated by clock driver 415, second register 435, and OCD 445.

Figure 8B:
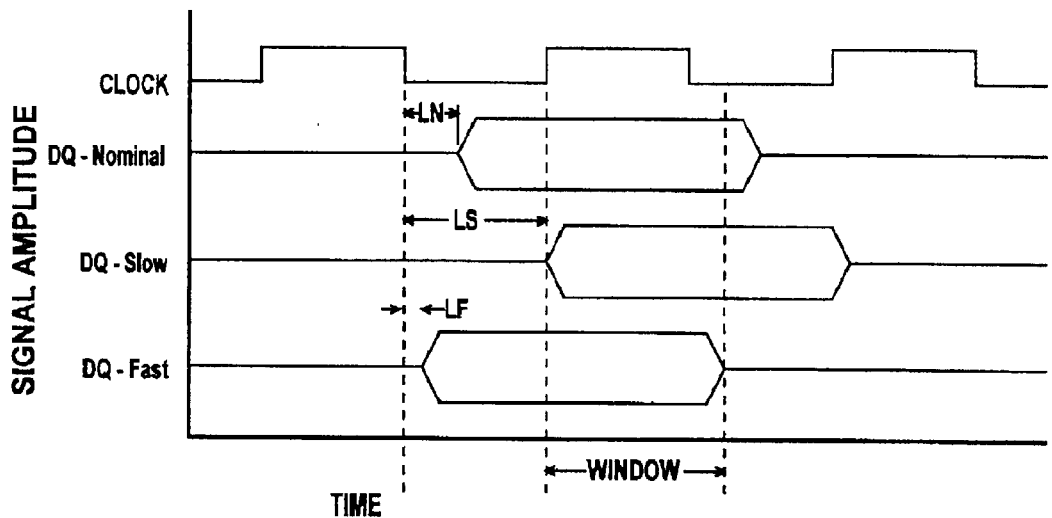
FIG. 8B is a timing diagram of the circuit of FIG. 8A.

FIG. 8B is a timing diagram of the circuit of FIG. 8A. In a nominal DGC 400 the DQ signal lags the CLOCK pulse by a time period LN. In a slow DGC 400 the DQ signal lags the CLOCK pulse by a time period LS>LN. In a fast DGC 400 the DQ signal lags the CLOCK pulse by a time period LF<LN. The window for valid data is defined as the time from the slowest possible DQ in to the time of the fastest DQ out. Thus, as the process variations increase, the valid data window decreases.

Figure 8C:
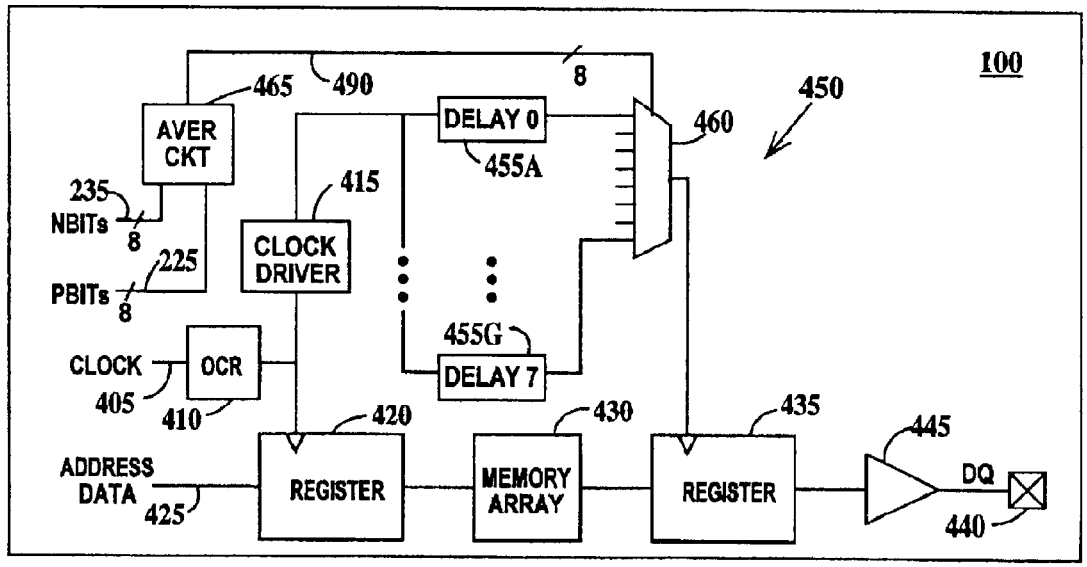
FIG. 8C is a schematic diagram of an exemplary data-generating circuit with a tunable data window circuit according to the present invention

FIG. 8C is a schematic diagram of an exemplary output driver with a tunable data window circuit according to the present invention. In FIG. 8C, integrated circuit chip 100 includes an DGC 450. The difference between DGC 450 and DGC 400 of FIG. 8A is the addition of eight delays 455A to 455G, multiplexer 460 and averaging circuit 465. The output of clock driver 415 is coupled to the inputs of delays 455A to 455G, each having a different delay. There are eight delays 455A to 455G because PBITs and NBITs are 8-bit words as described supra in reference to the example circuit of FIG. 5. The outputs of delays 455A to 455G are coupled to multiplexer 460, the output of multiplexer is coupled to the clock input of second register 435. A select line 490 couples the output of averaging circuit 465 to select input of multiplexer 460. The inputs of averaging circuit 465 are PBITs signal 225 and NBITs signal 235 (see FIG. 5). Thus based on $I_{DSAT}$ measurement data encoded on fuse banks 205A to 205N and 215A to 215N (see FIG. 5), a delay may be selected that delays a "fast"DGC 450 relative to the slowest specification so the valid data window increases.

Figure 9A:
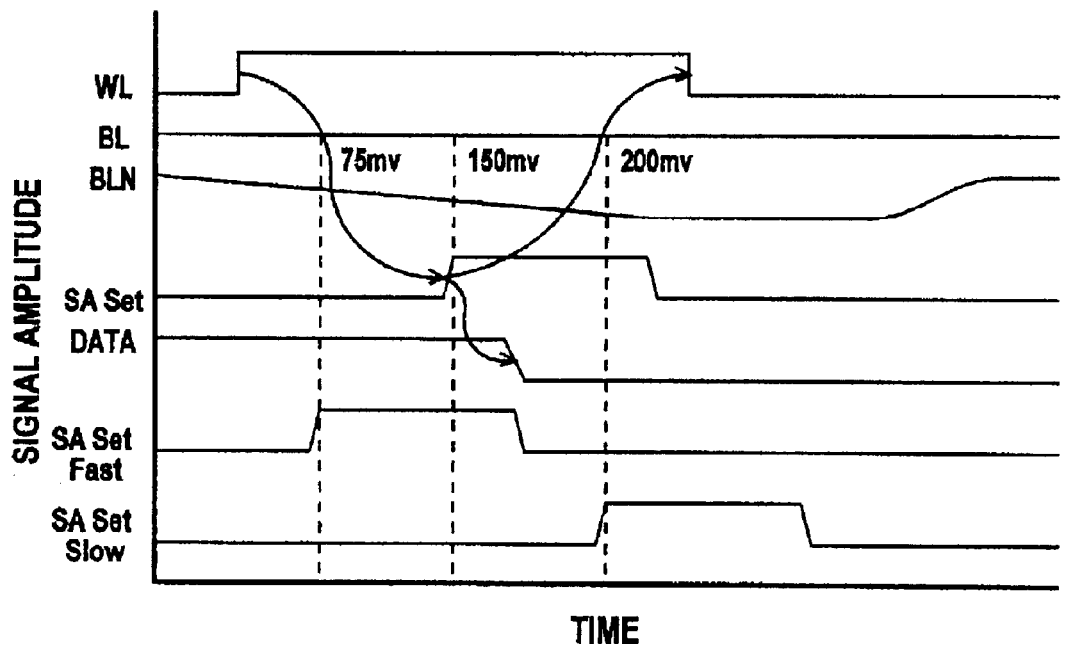
FIG. 9A is a timing diagram for a random access memory (RAM) core.
Figure 9B:
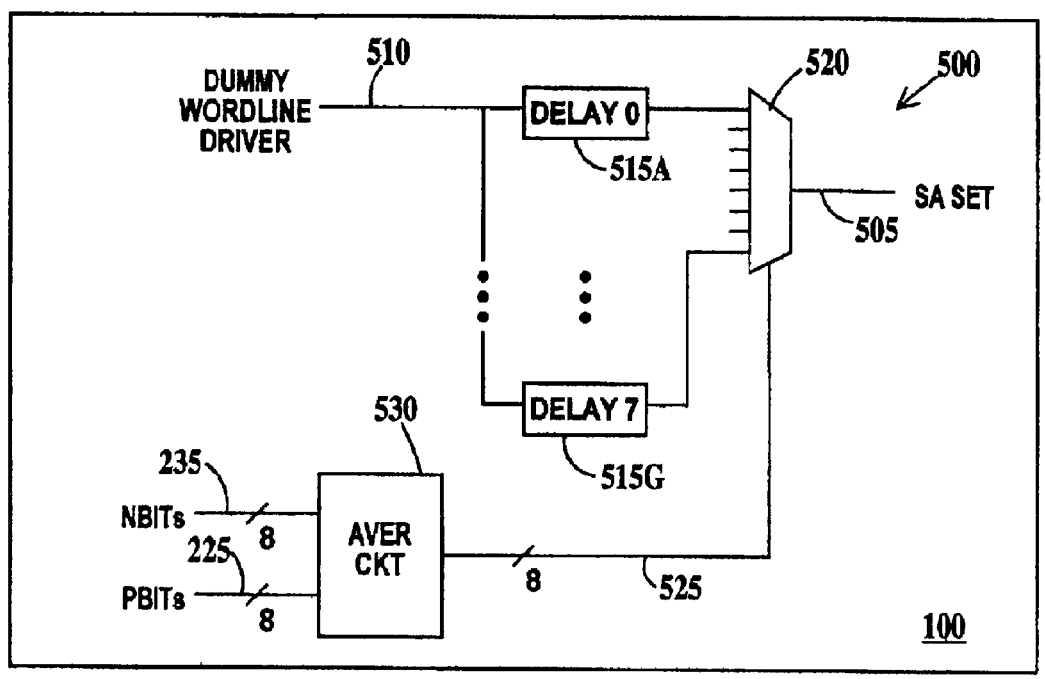
FIG. 9B is an exemplary tunable circuit for controlling turn-on of sense amplifiers of the RAM core of FIG. 9A according to the present invention.

FIG. 9A is a timing diagram for an embedded random access memory (RAM) core. In FIG. 9A, a wordline (WL) on enables the sense amplifier (SA) set signal, which in turns gates the DATA signal and in turn gates the WL off. A fast core will have an early SA set signal and a slow core will have a late SA set signal. One consequence of variable SA set signal timing is a variation in the voltage separation between a bitline (BL) signal and a bitline not (BLN) signal when the SAs set. For example, a core is designed with a nominal 150 mv separation between BL and BLN. In a fast core, the separation is only 75 mv, while in a slow core it is 200 mv. FIG. 9B is a tunable circuit for controlling turn-on of sense amplifiers of the RAM core of FIG. 9A according to the present invention.

FIG. 9B is an exemplary tunable circuit for controlling turn-on of sense amplifiers of the RAM core of FIG. 9A and is exemplary of core timing tuning according to the present invention. In FIG. 9B, integrated circuit chip 100 includes a delay circuit 500 for delaying SA set signal 505. A dummy wordline signal 510 is coupled to the input of eight delay circuits 515A to 515G, each having a different delay. There are eight delays 515A to 515G because PBITs and NBITs are 8-bit words as described supra in reference to the example circuit of FIG. 5. The outputs of delays 515A to 515G are coupled to a multiplexer 520. The output of de-multiplexer is delayed SA set signal 505. A select line 525 couples the output of an inverting averaging circuit 530 to the select input of multiplexer 520. The inputs of averaging circuit 530 are PBITs signal 225 and NBITs signal 235 (see FIG. 5). Thus based on $I_{DSAT}$ measurement data encoded on fuse banks 205A to 205N and 215A to 215N (see FIG. 5), a delay may be selected that delays dummy wordline signal 510 so an optimal voltage separation between BL and BLN can develop.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example the present invention may be applied to control delayed lock loop (DLL) jitter. Therefore, it is intended that the following claims cover all such modifications and changes as fall within the true spirit and scope of the invention.

What is claimed is:

1. A method of tuning an integrated circuit on an integrated circuit chip comprising:

performing a drain current at saturation measurement of one or more test field effect transistors on said integrated circuit chip;

selectively programming fuses of a bank of fuses on said integrated circuit chip based on said drain current at saturation measurement; and tuning an operation of said integrated circuit based on a pattern of blown and un-blown fuses in said bank of fuses.

2. The method of claim 1, wherein said test field effect transistors are P-channel field effect transistor, N-channel field effect transistors or both P-channel and N-channel field effect transistors.

3. The method of claim 1, wherein said one or more test N-channel field effect transistors and said one or more test P-channel field effect transistors include devices selected from the group of devices consisting of design nominal channel length devices, shorter than design nominal channel length devices, longer than design nominal channel length devices, nominal threshold voltage devices, higher than design nominal threshold voltage devices, lower than design nominal threshold devices, nominal gate dielectric thickness devices, thicker than design nominal gate dielectric devices, thinner than design nominal gate dielectric devices and combinations thereof.

4. The method of claim 1, further including performing drain current at aturation measurements on additional one or more test field effect transistors distributed about said integrated circuit chip and selectively programming additional banks of fuses on said integrated circuit chip.

5. The method of claim 4, wherein said one or more test field effect transistors and said additional one or more test field effect transistors are located in the corners of said integrated circuit chip.

6. The method of claim 4, wherein said one or more test field effect transistors is located in a core containing said integrated circuit to be tuned.

7. The method of claim 1, wherein said fuses are selected from the group consisting of laser blow fuses, electrical blow fuses and electrical blow antifuses.

8. The method of claim 1, further including the step of selecting which fuses to program based on a lookup table of lists of measured drain currents at saturation versus a corresponding predetermined list of fuse blow patterns.

9. The method of claim 1, wherein said tuning of said integrated circuit includes tuning selected from the group of consisting of N-channel field effect off chip driver impedance tuning, P-channel field effect off chip driver impedance tuning, noise to speed ratio off chip driver tuning, data valid window output tuning, core timing tuning and DLL jitter control tuning.

10. The method of claim 1, further including selecting one of said one or more test field effect transistors at a time to perform said drain current at saturation measurement on.

11. An electronic device comprising:
a drain current at saturation measurement circuit;
a corresponding bank of fuses; and
means for tuning an output of an integrated circuit to be tuned based upon drain current at saturation measurements encoded in a pattern of blown and un-blown fuses in said fuse bank.

12. The electronic device of claim 11, wherein said drain current at saturation measurement circuit includes one or more test P-channel field effect transistors, one or more test N-channel field effect transistors or one or more one or more test P-channel field effect transistors and one or more N-channel field effect transistors.

13. The electronic device of claim 12 further including means for selecting one N-channel test field effect transistor or P-channel field effect transistor at a time to perform said drain current at saturation measurement on.

14. The electronic device of claim 12, wherein said one or more test N-channel field effect transistors and said one or more test P-channel field effect transistors include devices selected from the group of devices consisting of design nominal channel length devices, shorter than design nominal channel length devices, longer than design nominal channel length devices, nominal threshold voltage devices, higher than design nominal threshold voltage devices, lower than design nominal threshold devices, nominal gate dielectric thickness devices, thicker than design nominal gate dielectric devices, thinner than design nominal gate dielectric devices and combinations thereof.

15. The electronic device of claim 11, further including means for generating a control signal for tuning said integrated circuit based on said pattern of blown and un-blown fuses in said fuse bank.

16. The electronic device of claim 11, further including additional drain current at saturation measurement circuits distributed about said integrated circuit chip and additional corresponding banks of fuses.

17. The electronic device of claim 16, wherein said drain current at saturation measurement circuit and said additional drain current at saturation measurement circuits are located in the corners of an integrated circuit chip.

18. The electronic device of claim 11, wherein said drain current at saturation measurement circuit is located in a core containing said integrated circuit to be tuned.

19. The electronic device of claim 11, wherein fuses of said bank of fuses are selected from the group consisting of laser blow fuses, electrical blow fuses and electrical blow antifuses.

20. The electronic device of claim 11, wherein said means for tuning said integrated circuit includes tunes the impedance on an output pad of an N-channel field effect off chip driver impedance tuning, tunes the impedance of a P-channel field effect off chip driver, adjusts the ratio of noise to speed of an off chip driver, adjusts the width of a data valid window of an output circuit, tunes the internal timing of a core timing tuning or adjusts jitter of a delayed lock loop circuit.

21. A method of tuning an integrated circuit on an integrated circuit chip comprising:
providing a drain current at saturation measurement circuit on said integrated circuit chip;
providing a corresponding bank of fuses on said integrated circuit chip; and
tuning an output of said integrated circuit based upon said drain current at saturation measurements made using said drain current at saturation measurement circuit encoded in a pattern of blown and un-blown fuses in said fuse bank.

22. The method of claim 21, wherein said drain current at saturation measurement circuit includes one or more test P-channel field effect transistors, one or more test N-channel field effect transistors, or one or more one or more test P-channel field effect transistors and one or more N-channel field effect transistors.

23. The method of claim 22 further including selecting one N-channel test field effect transistor or P-channel field effect transistor at a time to perform said drain current at saturation measurement on.

24. The method of claim 22, wherein said one or more test N-channel field effect transistors and said one or more test P-channel field effect transistors include devices selected from the group of devices consisting of design nominal channel length devices, shorter than design nominal channel length devices, longer than design nominal channel length devices, nominal threshold voltage devices, higher than design nominal threshold voltage devices, lower than design nominal threshold devices, nominal gate dielectric thickness devices, thicker than design nominal gate dielectric devices, thinner than design nominal gate dielectric devices and combinations thereof.

25. The method of claim 21, further including generating a control signal for tuning said integrated circuit based on said pattern of blown and un-blown fuses in said fuse bank.

26. The method of claim 21, further including providing additional drain current at saturation measurement circuits distributed about said integrated circuit chip and additional corresponding banks of fuses.

27. The method of claim 26, wherein said drain current at saturation measurement circuit and said additional drain current at saturation measurement circuits are located in the corners of an integrated circuit chip.

28. The method of claim 21, wherein said drain current at saturation measurement circuit is located in a core containing said integrated circuit to be tuned.

29. The method of claim 21, wherein fuses of said bank of fuses are selected from the group consisting of laser blow fuses, electrical blow fuses and electrical blow antifuses.

30. The method of claim 21, wherein said tuning of said output of said integrated circuit includes tuning selected from the group of consisting of N-channel field effect off chip driver impedance tuning, P-channel field effect off chip driver impedance tuning, noise to speed ratio off chip driver tuning, data valid window output tuning, core timing tuning and delayed lock loop jitter control tuning.

* * * * *

UNITED STATES PATENT AND TRADEMARK OFFICE
CERTIFICATE OF CORRECTION

PATENT NO. : 6,897,674 B2
DATED : May 24, 2005
INVENTOR(S) : Braceras et al.

It is certified that error appears in the above-identified patent and that said Letters Patent is hereby corrected as shown below:

Column 1,
Line 58, delete "nvention" and insert -- invention --

Column 2,
Line 43, delete "LEFF" and insert -- $L_{EFF}$ --

Column 3,
Line 48, delete "IDSAT" and insert -- $I_{DSAT}$ --

Column 4,
Line 20, delete "$_{DSAT}$" and insert -- $I_{DSAT}$ --
Line 31, delete "IDSAT" and insert -- $I_{DSAT}$ --

Column 5,
Line 5, delete "1851" and insert -- 185I --
Lines 6 and 8, delete "1901" and insert -- 190I --

Column 9,
Line 17, delete "aturation" and insert -- saturation --
Line 17, delete "one or more one or more" and insert -- one or more --

Signed and Sealed this

Ninth Day of August, 2005

JON W. DUDAS
*Director of the United States Patent and Trademark Office*